United States Patent
Cao et al.

(10) Patent No.: US 10,777,757 B2
(45) Date of Patent: Sep. 15, 2020

(54) OLED DISPLAY PANEL AND OLED DISPLAY DEVICE

(71) Applicant: Wuhan China Star Optoelectronics Semiconductor Display Technology Co., Ltd., Wuhan (CN)

(72) Inventors: Haoran Cao, Wuhan (CN); Pilgeun Chun, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/462,532

(22) PCT Filed: Aug. 30, 2018

(86) PCT No.: PCT/CN2018/103298
§ 371 (c)(1),
(2) Date: May 21, 2019

(87) PCT Pub. No.: WO2020/015059
PCT Pub. Date: Jan. 23, 2020

(65) Prior Publication Data
US 2020/0168821 A1    May 28, 2020

(30) Foreign Application Priority Data

Jul. 20, 2018 (CN) .......................... 2018 1 0801998

(51) Int. Cl.
*H01L 29/08* (2006.01)
*H01L 51/00* (2006.01)
*H01L 27/32* (2006.01)
*H01L 51/52* (2006.01)
*H01L 27/12* (2006.01)

(52) U.S. Cl.
CPC ........ *H01L 51/0097* (2013.01); *H01L 27/323* (2013.01); *H01L 27/3218* (2013.01); *H01L 27/3244* (2013.01); *H01L 51/524* (2013.01); *H01L 51/5253* (2013.01); *H01L 27/1218* (2013.01); *H01L 2251/5338* (2013.01)

(58) Field of Classification Search
CPC ... H01L 51/52; H01L 51/5253; H01L 51/524; H01L 51/0097; H01L 27/3218; H01L 27/3244; H01L 27/323
See application file for complete search history.

(56) References Cited

U.S. PATENT DOCUMENTS

| | | | |
|---|---|---|---|
| 2011/0260601 A1* | 10/2011 | Leatherdale | H01L 33/08 313/483 |
| 2017/0154935 A1* | 6/2017 | Cai | H01L 51/5209 |
| 2017/0199544 A1* | 7/2017 | Choi | H01L 51/5237 |
| 2019/0131565 A1* | 5/2019 | Kwon | H01L 51/5206 |

* cited by examiner

Primary Examiner — Phuc T Dang (57) ABSTRACT

An organic light emitting diode (OLED) display panel includes an array substrate. The array substrate includes a first zone, a second zone and a third zone spaced from one another. A first luminous area is disposed on the first zone. A second luminous area is disposed on the second zone. A third luminous area is disposed on the third zone. The third zone, the second zone and the first zone are stacked with one another. The second luminous area and third luminous area are disposed between the second zone and the third zone.

20 Claims, 6 Drawing Sheets

OLED DISPLAY PANEL AND OLED DISPLAY DEVICE

RELATED APPLICATIONS

This application is a National Phase of PCT Patent Application No. PCT/CN2018/103298 having International filing date of Aug. 30, 2018, which claims the benefit of priority of Chinese Patent Application No. 201810801998.3 filed on Jul. 20, 2018. The contents of the above applications are all incorporated by reference as if fully set forth herein in their entirety.

FIELD AND BACKGROUND OF THE INVENTION

The present invention relates to a display, and more specifically, to an organic light emitting diode (OLED) display panel and an OLED display device.

Current luminescent material of small and medium-sized OLED display panel is disposed beneath the TFT device by utilizing a deposition method and it requires a fine metal mask (FMM) in the deposition process. High resolution has been always a goal to pursue in display technology. OLED display panels achieve high resolution by decreasing the size of subpixel and the intervals between the pixels. To attain these, it requires an FMM with a better precision.

Current resolution of wide quad high definition (WQHD) is 1440×2960 (18.5:9). For example, in a 5.8-inch screen, pixels per inch (PPI) shall reach to 570 and the interval between the subpixels shall be about 18 μm. Regarding FMM, this is difficult to achieve. For 800 ppi or 1500 ppi, it is more difficult to realize. Therefore, defects are existed in the conventional technology and needed to be solved.

SUMMARY OF THE INVENTION

An object of the present disclosure is to provide an organic light emitting diode (OLED) display panel and OLED display device having a high resolution. An object of the present disclosure is to provide an OLED display panel, includes an array substrate, a first luminous area, a second luminous area and a third luminous area. The array substrate includes a first zone, a second zone and a third zone spaced from one another. A first bending section connects the first zone to the second zone. A second bending section connects the second zone to the third zone. The first bending section and the second bending section are bended in an opposite bending direction.

The first luminous area is disposed on the first zone. A second luminous area is disposed on the second zone. A third luminous area is disposed on the third zone. The third zone, the second zone and the first zone are stacked with one another. The second luminous area and third luminous area are disposed between the second zone and the third zone. The first luminous area includes a plurality of first subpixels spaced from one another. The second luminous area includes a plurality of second subpixels spaced from one another. The third luminous area includes a plurality of third subpixels spaced from one another. A third encapsulation layer is disposed on the third luminous area. A second encapsulation layer is disposed on the second luminous area. The third encapsulation layer and the second encapsulation layer are disposed between third luminous area and second luminous area.

In an embodiment of the present invention, the first subpixels, the second subpixels and the third subpixels are disposed on the first zone, the second zone and the third zone respectively.

In an embodiment of the present invention, the first subpixels, the second subpixels and the third subpixels are offset from each other relative to a direction from the first zone to the third zone. Two adjacent said first subpixels are spaced in a first interval. The second subpixel and the third subpixel are disposed within the first interval between the two adjacent first subpixels.

In an embodiment of the present invention, the array substrate includes a flexible substrate layer and a thin-film transistor driver layer disposed on the flexible substrate layer.

In an embodiment of the present invention, the first zone and the second zone are overlapped. A flexible substrate layer of the first zone and a flexible substrate layer of the second zone are overlapped with each other.

In an embodiment of the present invention, a first encapsulation layer is disposed on the first luminous area. A thickness of the first encapsulation layer is greater than a thickness of each of a second encapsulation layer and a third encapsulation layer.

In an embodiment of the present invention, a bending radius of the second bending section is same as a bending radius of the first bending section. A length of the second bending section is greater than a length of the first bending section.

In an embodiment of the present invention, the OLED display panel further includes a touch layer and a glass cover disposed on the first encapsulation layer.

In an embodiment of the present invention, another OLED display panel is also provided. The OLED display panel includes an array substrate, a first luminous area, a second luminous area and a third luminous area. The array substrate includes a first zone, a second zone and a third zone spaced from one another. A first bending section connects the first zone to the second zone. A second bending section connects the second zone to the third zone. The first bending section and the second bending section are bended in a opposite bending direction. A first luminous area is disposed on the first zone. A second luminous area is disposed on the second zone. A third luminous area is disposed on the third zone. The third zone, the second zone and the first zone are stacked with one another. The second luminous area and third luminous area are disposed between the second zone and the third zone.

In an embodiment of the present invention, the first luminous area includes a plurality of first subpixels spaced from one another. The second luminous area includes a plurality of second subpixels spaced from one another. The third luminous area includes a plurality of third subpixels spaced from one another.

In an embodiment of the present invention, the first subpixels, the second subpixels and the third subpixels are disposed on the first zone, the second zone and the third zone respectively.

In an embodiment of the present invention, the first subpixels, the second subpixels and the third subpixels are offset from each other relative to a direction from the first zone to the third zone. Two adjacent said first subpixels are spaced in a first interval. The second subpixel and the third subpixel are disposed within the first interval between the two adjacent first subpixels.

In an embodiment of the present invention, the array substrate includes a flexible substrate layer and a thin-film transistor driver layer disposed on the flexible substrate layer.

In an embodiment of the present invention, the first zone and the second zone are overlapped. A flexible substrate layer of the first zone and a flexible substrate layer of the second zone are overlapped with each other.

In an embodiment of the present invention, a third encapsulation layer is disposed on the third luminous area. A second encapsulation layer is disposed on the second luminous area. The third encapsulation layer and the second encapsulation layer are disposed between third luminous area and second luminous area.

In an embodiment of the present invention, a first encapsulation layer is disposed on the first luminous area. A thickness of the first encapsulation layer is greater than a thickness of each of a second encapsulation layer and a third encapsulation layer.

In an embodiment of the present invention, a bending radius of the second bending section is same as a bending radius of the first bending section. A length of the second bending section is greater than a length of the first bending section.

In an embodiment of the present invention, the OLED display panel further includes a touch layer and a glass cover disposed on the first encapsulation layer.

In an embodiment of the present invention, an OLED display device is also provided. An OLED display device includes an OLED display panel. The OLED display panel includes an array substrate, a first luminous area, a second luminous area, a third luminous area. The array substrate includes a first zone, a second zone and a third zone spaced from one another. A first bending section connects the first zone to the second zone. A second bending section connects the second zone to the third zone. The first bending section and the second bending section are bended in an opposite bending direction. A first luminous area is disposed on the first zone. A second luminous area is disposed on the second zone. A third luminous area is disposed on the third zone. The third zone, the second zone and the first zone are stacked with one another. The second luminous area and third luminous area are disposed between the second zone and the third zone.

In an embodiment of the present invention, the first luminous area includes a plurality of first subpixels spaced from one another. The second luminous area includes a plurality of second subpixels spaced from one another. The third luminous area includes a plurality of third subpixels spaced from one another.

An advantage of the present invention is to provide an OLED display panel comprising an array substrate, a first luminous area, a second luminous area and a third luminous area. The array substrate includes a first zone, a second zone and a third zone spaced from one another. A first bending section connects the first zone to the second zone. A second bending section connects the second zone to the third zone. The first bending section and the second bending section are bended in an opposite bending direction. The first luminous area is disposed on the first zone. A second luminous area is disposed on the second zone. A third luminous area is disposed on the third zone. The third zone, the second zone and the first zone are stacked with one another. The second luminous area and third luminous area are disposed between the second zone and the third zone. The present invention utilizes the stacked pixel layer to increase the space for disposing subpixels to arrange more subpixels on the OLED display panel and increase the resolution.

BRIEF DESCRIPTION OF THE SEVERAL VIEWS OF THE DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

DESCRIPTION OF SPECIFIC EMBODIMENTS OF THE INVENTION

The embodiments of the present disclosure are described in detail hereinafter. Examples of the described embodiments are given in the accompanying drawings, wherein the identical or similar reference numerals constantly denote the identical or similar elements or elements having the identical or similar functions. In the description of the present disclosure, it should be understood that terms such as "upper," "lower," "front," "rear," "left," "right," "inside," "outside," "lateral," as well as derivative thereof should be construed to refer to the orientation as then described or as shown in the drawings under discussion. These relative terms are for convenience of description, do not require that the present disclosure be constructed or operated in a particular orientation, and shall not be construed as causing limitations to the present disclosure.

In the description of the present disclosure, it should be understood that terms such as "center," "longitudinal," "lateral," "length," "width," "thickness," "upper," "lower," "front," "rear," "left," "right," "vertical," "horizontal," "top," "bottom," "inside," "outside," "clockwise," "counterclockwise" as well as derivative thereof should be construed to refer to the orientation as then described or as shown in the drawings under discussion. These relative terms are for convenience of description, do not require that the present disclosure be constructed or operated in a particular orientation, and shall not be construed as causing limitations to the present disclosure. In addition, terms such as "first" and "second" are used herein for purposes of description and are not intended to indicate or imply relative importance or significance. Thus, features limited by "first" and "second" are intended to indicate or imply including one or more than one these features. In the description of the present disclosure, "a plurality of" relates to two or more than two, unless otherwise specified.

In the description of the present disclosure, it should be noted that unless there are express rules and limitations, the terms such as "mount," "connect," and "bond" should be comprehended in broad sense. For example, it can mean a permanent connection, a detachable connection, or an integrate connection; it can mean a mechanical connection, an electrical connection, or can communicate with each other; it can mean a direct connection, an indirect connection by an intermediate, or an inner communication or an interreaction between two elements. A person skilled in the art should understand the specific meanings in the present disclosure according to specific situations.

In the description of the present disclosure, unless specified or limited otherwise, it should be noted that, a structure in which a first feature is "on" or "beneath" a second feature may include an embodiment in which the first feature directly contacts the second feature and may also include an embodiment in which an additional feature is formed between the first feature and the second feature so that the first feature does not directly contact the second feature. Furthermore, a first feature "on," "above," or "on top of" a second feature may include an embodiment in which the first feature is right "on," "above," or "on top of" the second feature and may also include an embodiment in which the first feature is not right "on," "above," or "on top of" the second feature, or just means that the first feature has a sea level elevation greater than the sea level elevation of the second feature. While first feature "beneath," "below," or "on bottom of" a second feature may include an embodiment in which the first feature is right "beneath," "below," or "on bottom of" the second feature and may also include an embodiment in which the first feature is not right "beneath," "below," or "on bottom of" the second feature, or just means that the first feature has a sea level elevation less than the sea level elevation of the second feature.

The disclosure herein provides many different embodiments or examples for realizing different structures of the present disclosure. In order to simplify the disclosure of the present disclosure, components and settings of specific examples are described below. Of course, they are only examples and are not intended to limit the present disclosure. Furthermore, reference numbers and/or letters may be repeated in different examples of the present disclosure. Such repetitions are for simplification and clearness, which per se do not indicate the relations of the discussed embodiments and/or settings. Moreover, the present disclosure provides examples of various specific processes and materials, but the applicability of other processes and/or application of other materials may be appreciated by a person skilled in the art.

Figure 1:
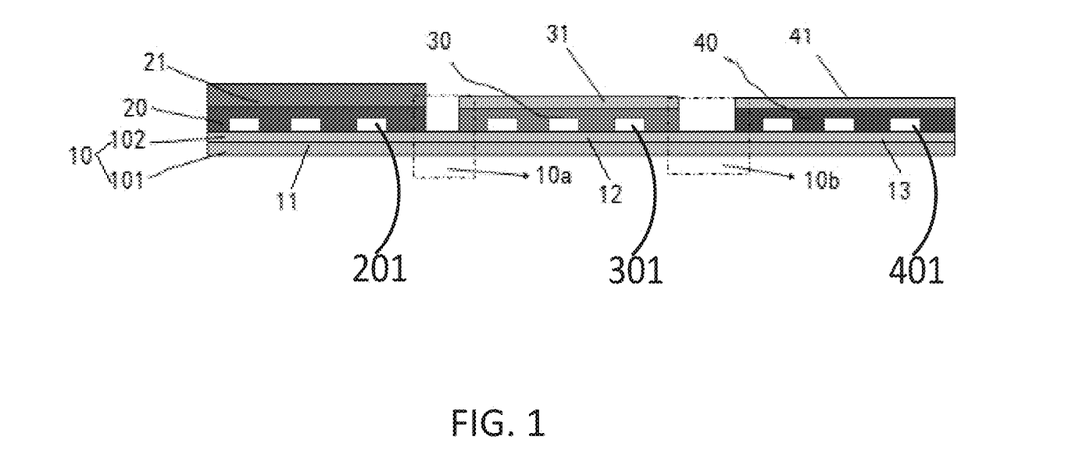
FIG. 1 is a schematic diagram of an OLED display panel in an intermediate state according to a first embodiment of the present invention.
Figure 2:
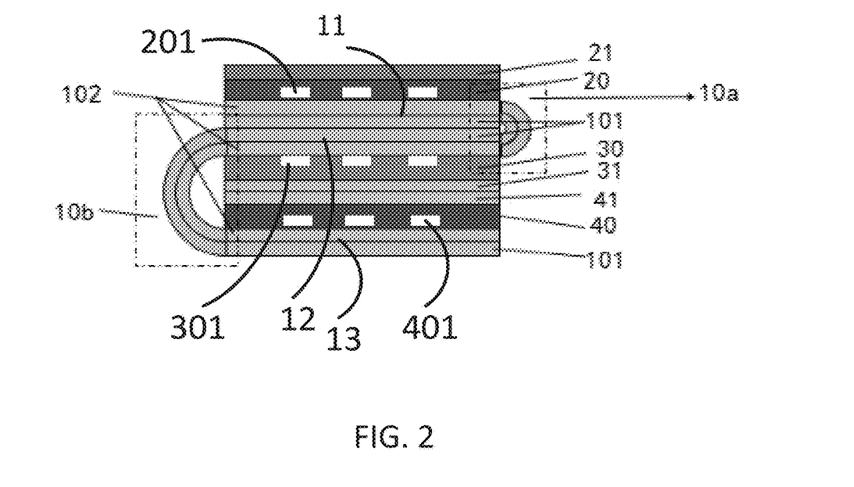
FIG. 2 is a schematic diagram of the OLED display panel according to the first embodiment of the present invention.

Referring to FIG. 1 and FIG. 2, FIG. 1 is a schematic diagram of an organic light emitting diode (OLED) display panel in an intermediate state according to a first embodiment of the present invention. FIG. 2 is a schematic diagram of the OLED display panel according to the first embodiment of the present invention. For clarification, FIG. 1 is a schematic diagram before the OLED display panel is folded as FIG. 2. A person skilled in the art is able to fold the OLED display panel as shown in FIG. 1 to a folded state as shown in FIG. 2. Combining FIG. 1 and FIG. 2, the OLED display panel according to the first embodiment of the present invention includes an array substrate 10, a first luminous area 20, a second luminous area 30 and a third luminous area 40. The array substrate 10 includes a first zone 11, a second zone 12 and a third zone 13 spaced from one another. A first bending section 10a connects the first zone 11 to the second zone 12. A second bending section 10b connects the second zone 12 to the third zone 13. The first bending section 10a and the second bending section 10b are bended in opposite bending directions. The first luminous area 20 is disposed on the first zone 11. The second luminous area 30 is disposed on the second zone 12. The third luminous area 40 is disposed on the third zone 13. The third zone 13, the second zone 12 and the first zone 11 are stacked with one another. The second luminous area 30 and third luminous area 40 are disposed between the second zone 12 and the third zone 13.

In the embodiment of the present invention, the array substrate 10 includes a flexible substrate layer 101 and a thin-film transistor driver layer 102 disposed on the flexible substrate layer 101.

In the embodiment of the present invention, the first luminous area 20 includes a plurality of first subpixels 201 spaced from one another. The second luminous area 30 includes a plurality of second subpixels 301 spaced from one another. The third luminous area 40 includes a plurality of third subpixels 401 spaced from one another. The first subpixels 201, the second subpixels 301 and the third subpixels 401 can be red subpixels, green subpixels and blue subpixels or any combination thereof. The red subpixels are correspondingly vapor-deposited with red luminous material. The green subpixels are correspondingly vapor-deposited with green luminous material. The blue subpixels are correspondingly vapor-deposited with blue luminous material.

In the embodiment of the present invention, a first encapsulation layer 21 is disposed on the first luminous area 20. An encapsulation layer 31 is disposed on the second luminous area 30. A third encapsulation layer 41 is disposed on the third luminous area 40. A thickness of the first encapsulation layer 21 is greater than a thickness of each of the second encapsulation layer 31 and the third encapsulation layer 41.

Referring to FIG. 1, the array substrate 10 utilizes the first bending section 10a and the second bending section 10b to fold the first zone 11, the second zone 12 and the third zone 13 to be stacked with one another. The first bending section 10a and the second bending section 10b are bended in opposite bending directions. The second luminous area 30 and the third luminous area 40 are disposed between the second zone 12 and the third zone 13.

The third zone 13 of the array substrate 10, the third luminous area 40, the third encapsulation layer 41, the second encapsulation layer 31, the second luminous area 30, the second zone 12 of the array substrate 10, the first zone 11 of the array substrate 10, the first luminous area 20 and the first encapsulation layer 21 are sequentially stacked with one another. Therefore, the third zone 13, the second zone 12 and the first zone 11 are stacked with one another. The second luminous area 30 and the third luminous area 40 are disposed between the second zone 12 and the third zone 13.

In the embodiment of the present invention, the first zone 11 and the second zone 12 are overlapped. A flexible substrate layer 101 of the first zone 11 and a flexible substrate layer 101 of the second zone 12 are overlapped with each other.

Referring to FIG. 2, the first subpixels 201, the second subpixels 301 and the third subpixels 401 are disposed on the first zone 11, the second zone 12 and the third zone 13 respectively.

In this embodiment, the deposition process of the three luminous areas does not need the fine metal mask (FMM)

with a high precision and only needs an open mask to realize the deposition of the luminous materials. The blue subpixels are vapor-deposited with the blue luminous material. The green subpixels are vapor-deposited with the green luminous material. The red subpixels are vapor-deposited with the red luminous material. Alignment of said three subpixels is achieved by overlapping the opening areas thereof. While the luminous material of upper layer does not illuminate, it does not influence the illumination of the lower layer. The flexible substrate and the TFT device of the array layer require good optical transmission to guarantee the light emitted from the lower layer to transmit through the TFT device layer and the upper layer.

Preferably, in order to consider the spectrum and to decrease the absorption of the blue light by the other subpixels, the first subpixels 201 are blue subpixels and disposed as the top layer. The second subpixels 301 are green subpixels and disposed as the middle layer. The third subpixels 401 are red subpixels and disposed as the bottom layer.

Figure 3:
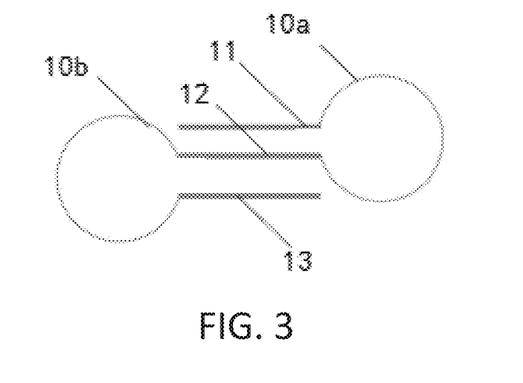
FIG. 3 is a simplified, schematic diagram of the OLED display panel according to the first embodiment of the present invention.

Referring to FIG. 3, a bending radius of the second bending section 10b is the same as a bending radius of the first bending section 10a. A length of the second bending section 10b is greater than a length of the first bending section 10a to effectively increase the bending radius and to reduce the risk of fracture of the metal wire in the array layer.

Figure 4:
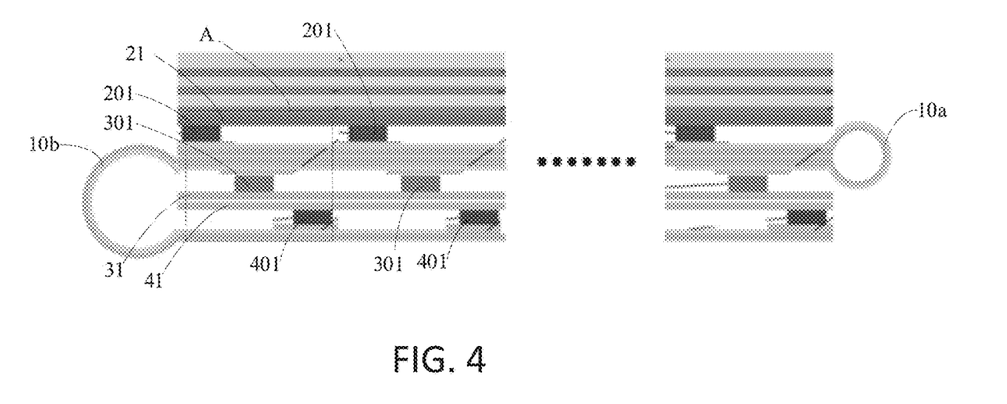
FIG. 4 is a schematic diagram of an OLED display panel according to a second embodiment of the present invention.
Figure 5:
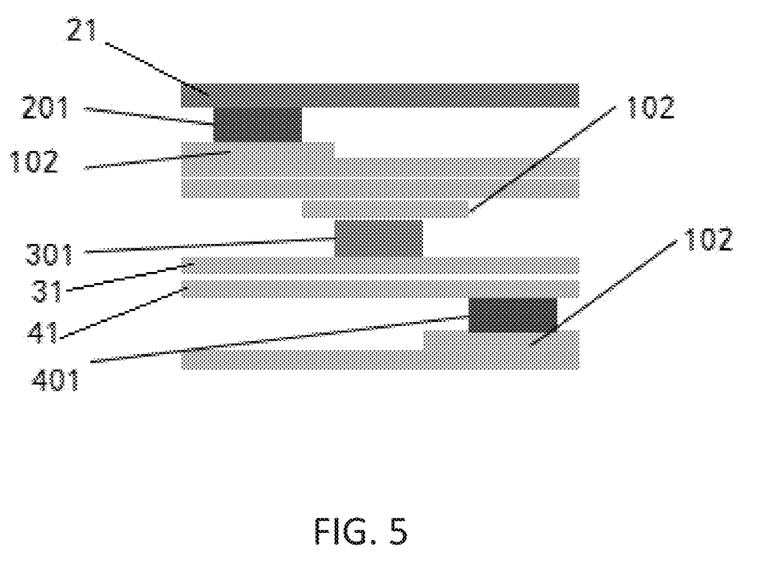
FIG. 5 is a partially enlarged view of portion A of the OLED display panel according to the second embodiment of the present invention.

Referring to FIG. 4 and FIG. 5, FIG. 4 is a schematic diagram of an OLED display panel according to a second embodiment of the present invention. The difference of the OLED display panel between FIG. 4 and FIG. 2 is that the vertical projections of the first subpixels 201, the second subpixels 301 and the third subpixels of FIG. 4 are spaced from each other. The first subpixel 201, the second subpixel 301, and the third subpixel 401 of the same pixel are disposed separately. By controlling the overlapping distance between different illuminating areas of the projections of the different subpixels, the present invention can have different ratios of color mixture, thereby to enlarge the color gamut and contrast of the display.

Specifically, two adjacent first subpixels 201 are spaced from each other in a first interval. The first subpixels 201, the second subpixels 301 and the third subpixels 401 are offset from each other relative to a direction from the first zone 11 to the third zone 13. The second subpixel 301 and the third subpixel 401 are disposed within the first interval between the two adjacent first subpixels 201. A sum of lengths of projections of the second subpixel 301 and the third subpixel 401 on the array substrate is smaller than the first interval. The first interval in accordance with the present embodiment can be predetermined according to the needs and is not to limit the present disclosure.

Furthermore, the OLED display panel includes a touch layer and a glass cover. The touch layer and the glass cover are disposed on the first encapsulation layer sequentially.

Figure 6:
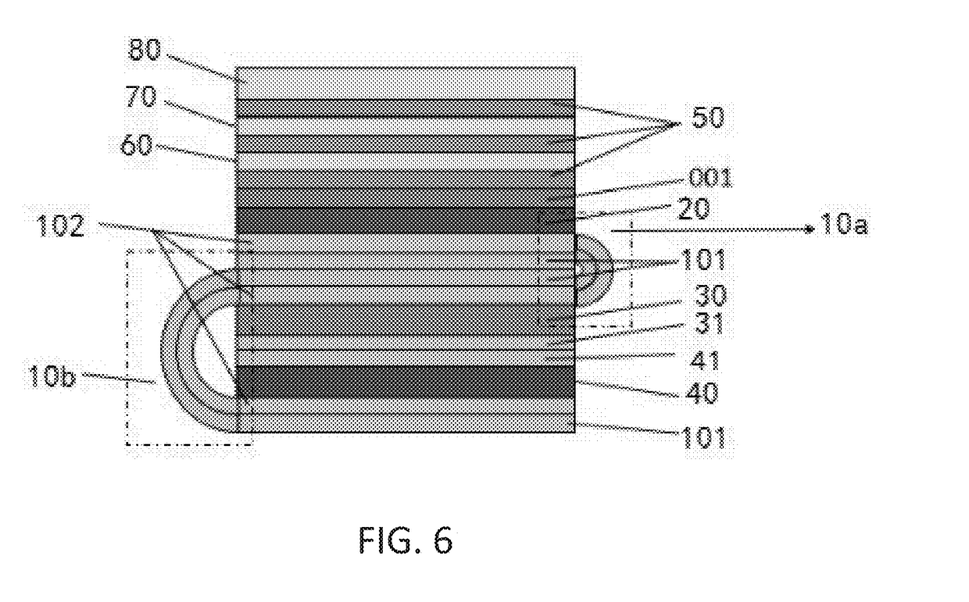
FIG. 6 is a schematic diagram of the OLED display panel according to the first and second embodiment of the present invention.

Referring to FIG. 6, the present invention provides an OLED display device including the display panel described above. The OLED display panel includes a polarizer 60, a touch panel 70 and a protective layer 80. The polarizer 60, the touch panel 70 and the protective layer 80 are adhered together by utilizing optical glue layers 50. The polarizer 60 and the first encapsulation layer 21 are connected together by utilizing an optical glue layer 50.

Specifically, the OLED display panel can be referred to the above disclosure of the above embodiments. Details thereof are omitted here.

An advantage of the present invention is to provide an OLED display panel and an OLED display device. The OLED display panel includes an array substrate, a first luminous area, a second luminous area and a third luminous area. The array substrate includes a first zone, a second zone and a third zone spaced from one another. A first bending section connects the first zone to the second zone. A second bending section connects the second zone to the third zone. The first bending section and the second bending section are bended in opposite bending directions. The first luminous area is disposed on the first zone. The second luminous area is disposed on the second zone. The third luminous area is disposed on the third zone. The third zone, the second zone and the first zone are stacked with one another. The second luminous area and third luminous area are disposed between the second zone and the third zone. The present invention utilizes the stacked pixel layers to increase the space for disposing subpixels to arrange more subpixels on the OLED display panel, thereby to increase the resolution of the display.

The present invention provides an OLED display panel and an OLED display device. The present disclosure has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims.

What is claimed is:

1. An organic light emitting diode (OLED) display panel, comprising:
   an array substrate comprising a first zone, a second zone and a third zone spaced from one another, a first bending section connecting the first zone to the second zone, a second bending section connecting the second zone to the third zone; the first bending section and the second bending section bended in an opposite bending direction;
   a first luminous area disposed on the first zone,
   a second luminous area disposed on the second zone,
   a third luminous area disposed on the third zone,
   the third zone, the second zone and the first zone stacked with one another;
   the second luminous area and third luminous area disposed between the second zone and the third zone; and
   wherein, the first luminous area comprises a plurality of first subpixels spaced from one another, the second luminous area comprises a plurality of second subpixels spaced from one another, the third luminous area comprises a plurality of third subpixels spaced from one another; and
   wherein a third encapsulation layer is disposed on the third luminous area, a second encapsulation layer is disposed on the second luminous area, and the third encapsulation layer and the second encapsulation layer are disposed between third luminous area and second luminous area.

2. The OLED display panel according to claim 1, wherein the first subpixels, the second subpixels and the third subpixels are disposed on the first zone, the second zone and the third zone respectively.

3. The OLED display panel according to claim 1, wherein the first subpixels, the second subpixels and the third subpixels are offset from each other relative to a direction from the first zone to the third zone, two adjacent said first subpixels are spaced from each other in a first interval; and the second subpixel and the third subpixel are disposed within the first interval between the two adjacent first subpixels.

4. The OLED display panel according to claim 1, wherein the array substrate comprises a flexible substrate layer and a thin-film transistor driver layer disposed on the flexible substrate layer.

5. The OLED display panel according to claim 4, wherein the first zone and the second zone are overlapped; and the flexible substrate layer of the first zone and the flexible substrate layer of the second zone are overlapped with each other.

6. The OLED display panel according to claim 1, wherein a first encapsulation layer is disposed on the first luminous area; and a thickness of the first encapsulation layer is greater than a thickness of each of a second encapsulation layer and the third encapsulation layer.

7. The OLED display panel according to claim 6, wherein a bending radius of the second bending section is same as a bending radius of the first bending section; a length of the second bending section is greater than a length of the first bending section.

8. The OLED display panel according to claim 6, comprises a touch layer and a glass cover disposed on the first encapsulation layer.

9. An organic light emitting diode (OLED) display panel, comprising:
   an array substrate comprising a first zone, a second zone and a third zone spaced from one another, a first bending section connecting the first zone to the second zone, a second bending section connecting the second zone to the third zone; the first bending section and the second bending section bended in a opposite bending direction;
   a first luminous area disposed on the first zone,
   a second luminous area disposed on the second zone,
   a third luminous area disposed on the third zone, and
   the third zone, the second zone and the first zone stacked with one another; the second luminous area and third luminous area disposed between the second zone and the third zone.

10. The OLED display panel according to claim 9, wherein the first luminous area comprising a plurality of first subpixels spaced from one another, the second luminous area comprising a plurality of second subpixels spaced from one another, and the third luminous area comprising a plurality of third subpixels spaced from one another.

11. The OLED display panel according to claim 10, wherein the first subpixels, the second subpixels and the third subpixels are disposed on the first zone, the second zone and the third zone respectively.

12. The OLED display panel according to claim 10, wherein the first subpixels, the second subpixels and the third subpixels are offset from each other relative to a direction from the first zone to the third zone, two adjacent said first subpixels are spaced in a first interval; the second subpixel and the third subpixel are disposed within the first interval between the two adjacent first subpixels.

13. The OLED display panel according to claim 9, wherein the array substrate comprises a flexible substrate layer and a thin-film transistor driver layer disposed on the flexible substrate layer.

14. The OLED display panel according to claim 13, wherein the first zone and the second zone are overlapped; a flexible substrate layer of the first zone and a flexible substrate layer of the second zone are overlapped with each other.

15. The OLED display panel according to claim 9, wherein a third encapsulation layer disposed on the third luminous area, a second encapsulation layer disposed on the second luminous area, the third encapsulation layer and the second encapsulation layer disposed between third luminous area and second luminous area.

16. The OLED display panel according to claim 15, wherein a first encapsulation layer is disposed on the first luminous area; a thickness of the first encapsulation layer is greater than a thickness of each of a second encapsulation layer and the third encapsulation layer.

17. The OLED display panel according to claim 16, wherein a bending radius of the second bending section is same as a bending radius of the first bending section; and a length of the second bending section is greater than a length of the first bending section.

18. The OLED display panel according to claim 16, further comprising a touch layer and a glass cover disposed on the first encapsulation layer.

19. An organic light emitting diode (OLED) display device comprises an OLED display panel, comprising:
   an array substrate comprising a first zone, a second zone and a third zone spaced from one another, a first bending section connecting the first zone to the second zone, a second bending section connecting the second zone to the third zone; the first bending section and the second bending section bended in a opposite bending direction;
   a first luminous area disposed on the first zone,
   a second luminous area disposed on the second zone,
   a third luminous area disposed on the third zone, and
   the third zone, the second zone and the first zone stacked with one another; the second luminous area and third luminous area disposed between the second zone and the third zone.

20. The OLED display device according to claim 19, wherein the first luminous area comprises a plurality of first subpixels spaced from one another, the second luminous area comprises a plurality of second subpixels spaced from one another and the third luminous area comprises a plurality of third subpixels spaced from one another.

* * * * *